United States Patent [19]
Cabral, Jr. et al.

[11] Patent Number: 5,834,374
[45] Date of Patent: Nov. 10, 1998

[54] METHOD FOR CONTROLLING TENSILE AND COMPRESSIVE STRESSES AND MECHANICAL PROBLEMS IN THIN FILMS ON SUBSTRATES

[75] Inventors: Cyril Cabral, Jr., Ossining; Lawrence Alfred Clevenger, LaGrangeville; François Max d'Heurle, Ossining, all of N.Y.; Qi-Zhong Hong, Dallas, Tex.

[73] Assignee: International Business Machines Corporation, Armonk, N.Y.

[21] Appl. No.: 431,791

[22] Filed: May 1, 1995

Related U.S. Application Data

[62] Division of Ser. No. 316,608, Sep. 30, 1994, abandoned.

[51] Int. Cl.$^6$ ................................................ H01L 21/44
[52] U.S. Cl. .................................... 438/685; 438/686
[58] Field of Search .................................... 437/245, 247; 427/228, 224; 438/648, 650, 685, 686

[56] References Cited

U.S. PATENT DOCUMENTS

| | | |
|---|---|---|
| 3,026,200 | 3/1962 | Gregory et al. |
| 3,399,086 | 8/1968 | Das et al. |
| 3,779,714 | 12/1973 | Nadkarni et al. ............... 29/182.5 |
| 3,922,180 | 11/1975 | Fuchs et al. ............... 148/11.5 R |
| 4,077,830 | 3/1978 | Fulwiler ............... 156/249 |
| 4,315,777 | 2/1982 | Nadkarni et al. ............... 75/232 |
| 4,322,754 | 3/1982 | Mason ............... 358/296 |
| 4,383,284 | 5/1983 | Isshiki ............... 360/125 |
| 4,772,452 | 9/1988 | Brupbacher et al. ............... 420/129 |
| 4,887,146 | 12/1989 | Hinode ............... 357/71 |
| 4,915,908 | 4/1990 | Nagle et al. ............... 420/590 |
| 5,063,120 | 11/1991 | Edmonson et al. ............... 428/694 |
| 5,190,807 | 3/1993 | Kimock et al. ............... 428/216 |
| 5,253,122 | 10/1993 | Chiba et al. ............... 360/33.1 |
| 5,279,026 | 1/1994 | Uhde ............... 29/603 |
| 5,285,109 | 2/1994 | Tomikawa et al. ............... 257/741 |
| 5,308,794 | 5/1994 | Tu ............... 437/194 |
| 5,336,547 | 8/1994 | Kawakita et al. ............... 428/209 |

FOREIGN PATENT DOCUMENTS

| | | |
|---|---|---|
| 54-13262 | 1/1979 | Japan . |
| 62-298167 | 12/1987 | Japan . |
| 1-201932 | 8/1989 | Japan . |
| 63-274402 | 12/1990 | Japan . |
| 3-101231 | 4/1991 | Japan . |
| 654962 | 7/1951 | Netherlands . |

OTHER PUBLICATIONS

"Preparation of High–Strength Materials by Controlling the Dispersion of a Second Phase" by S.R. Mader et al.; IBM Technical Disclosure Bulletin; vol. 9, No. 12, May 1967; pp. 1788–1789.

"The Emerging Role of Flexible Media" by Patel and Richards; IEEE, vol. 81, No. 4, pp. 595–606 (abstract only).

"The Promise of CD–ROM is Now Being Realized" by Dayton; Office, Sep. 1989, vol. 110, pp. 50, 56 (abstract only).

"On Data Security of Magnetic Data Media", Output, pp. 33–37, Feb. 1986 (abstract only).

*Primary Examiner*—Charles L. Bowers, Jr.
*Assistant Examiner*—Reneé R. Berry
*Attorney, Agent, or Firm*—Ratner & Prestia

[57] ABSTRACT

A method for forming thin films and controlling the tensile and compressive stresses and mechanical properties of the thin film. The method includes forming an alloy on a substrate having a solvent metal and a solute, then annealing the substrate and the alloy in one of an oxidizing, nitriding and carborizing ambient so that the ambient reacts with the solute to form respectively one of an oxide, nitride and carbide precipitates of the solute in the solvent. The solute is selected so that the precipitates formed may be used to control the mechanical properties of the solvent.

7 Claims, 9 Drawing Sheets

5,834,374

METHOD FOR CONTROLLING TENSILE AND COMPRESSIVE STRESSES AND MECHANICAL PROBLEMS IN THIN FILMS ON SUBSTRATES

This application is a division of application Ser. No. 08/316,608, filed Sep. 30, 1994, abandoned.

FIELD OF THE INVENTION

The present invention relates to a method and an apparatus for controlling the tensile and compressive stresses and mechanical properties in a thin film having a solute and a solvent on a substrate by forming within the thin film oxides, nitrides or carbides of the solute.

BACKGROUND OF THE INVENTION

It is well known by those skilled in the art that the control of stresses in thin films on substrates is critical for the conductivity, mechanical stability, and performance of semiconductor devices.

The problems with stresses, tensile and compressive, in thin films results from the mismatch between the thin film and substrate materials which cannot usually be modified and from the stresses that are created in the thin film by overlying dielectric films.

The presence of tensile stresses in the thin film may cause rupture and/or peeling of mechanically fragile films, for example chromium. In addition, tensile stresses have been shown to cause stress-voiding and rupture of thin film conductors. For example, interconnection lines formed on semiconductor substrates to interconnect different semiconductor devices may form voids which extend all the way across interconnection lines, causing open-circuit failure or notches may form at the edges of the interconnection lines causing partial loss of a cross sectional area, resulting in early electromigration failure.

Mechanically weak films may also undergo morphological modifications such as hillock growth because of the compressive stresses developed under heating and/or cooling cycles during the fabrication of the substrate on which the thin film has been formed.

One method of controlling stresses in thin films known by those skilled in the art is to use ion bombardment either during evaporation-condensation, or during sputtering (bias sputtering) when forming the thin film. This technique allows a compressive stress component to be added to the other stresses present in the thin film. Another solution to control the stresses in thin films has been to add gaseous impurities, for example, oxygen, to the thin film to introduce a compressive stress component. These gaseous impurities are added to the thin films using reactive evaporation or sputtering.

SUMMARY OF THE INVENTION

A method for forming a thin film on a substrate and a device directed to the same. The method includes forming an alloy having the formula $AB_x$ on a substrate where A is a solvent metal and B is a solute. Then annealing the substrate and the alloy in one of an oxidizing, nitriding and carborizing ambient so that the ambient reacts with the solute to form respectively one of an oxide, nitride and carbide precipitates of the solute in the solvent.

BRIEF DESCRIPTION OF THE DRAWINGS

The aspects, features and advantages of the present invention will be more readily understood from the following detailed description when read in conjunction with the accompanying drawings, in which.

DETAILED DESCRIPTION OF THE INVENTION

An exemplary method of the present invention will now be described more fully with reference to FIGS. 1–4, in which the formation of metal contacts to a semiconductor device are shown during successive stages of manufacture.

Figure 1:
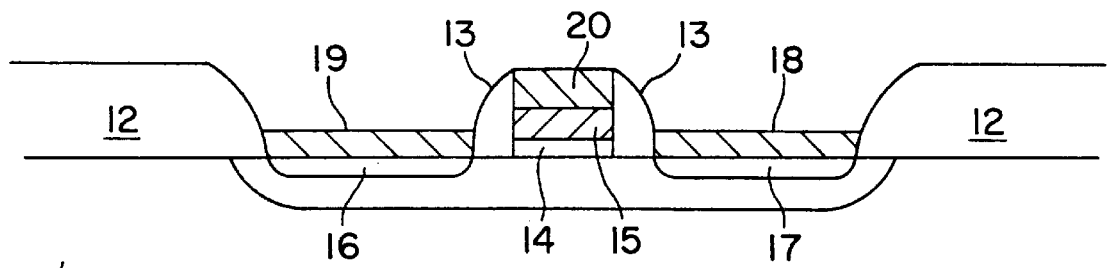
FIG. 1 shows a prior art multilayered NMOS device having source, drain and gate regions.

FIG. 1 shows a prior art n channel metal oxide semiconductor (NMOS) field effect transistor (FET) device which may be a portion of a complementary metal oxide semiconductor (CMOS) device. The NMOS device includes a single crystal silicon substrate 11 with oxide and/or nitride insulation layers 12 which separate the active area of the NMOS device from adjacent devices. A p channel metal oxide semiconductor (PMOS) device may be fabricated adjacent the NMOS device and interconnected to a CMOS device.

Although a silicon substrate is preferred, other semiconductor or compound semiconductor substrates selected from columns IIb, IIa, IVa, Va, and VIa of the periodic table may be used.

The gate region of the NMOS device includes gate oxide 14, polycrystalline silicon layer 15 and nitride and/or oxide thin film spacers 13. Thin film spacers 13 separate the gate region from source region 16 and drain region 17. On source 16, drain 17 and the gate region are formed silicide contacts 19, 18 and 20 respectively, forming an electrical connection with the CMOS device. The silicide contacts may be titanium silicide or cobalt silicide.

Figure 2:
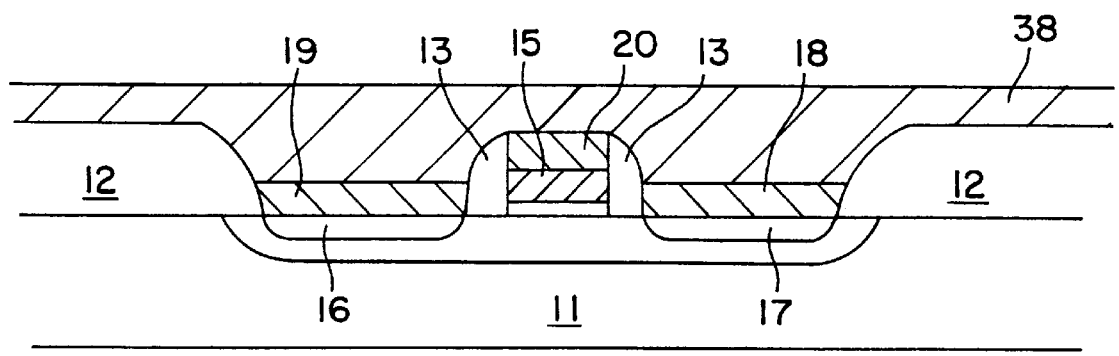
FIG. 2 is a cross-sectional schematic view of a NMOS device of the type shown in FIG. 1 after the deposition of a planarization layer.
Figure 3:
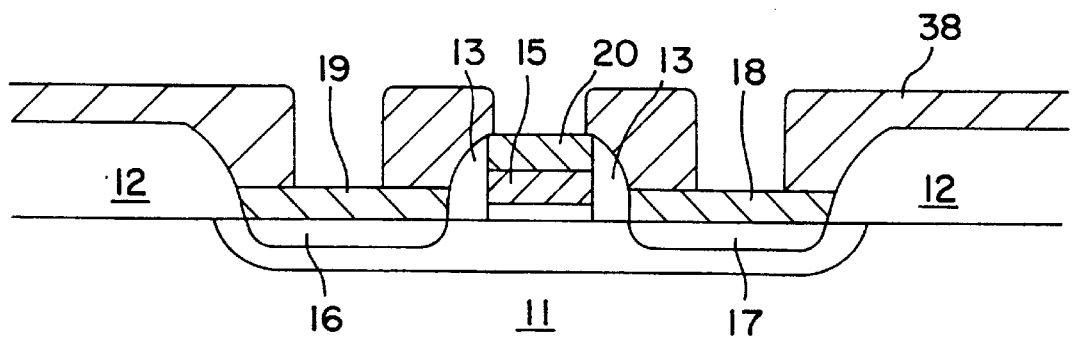
FIG. 3 is a cross-sectional schematic view of the exemplary embodiment of the present invention after the removal of the planarization layer over source, drain and gate regions.

As shown in FIG. 2, a planarization layer 38 is first deposited over insulation layer 12, and silicide contacts 19, 18 and 20 by, for example, chemical vapor deposition. The planarization layer 38 is a dielectric material. The planarization layer 38 is then selectively etched to expose silicide contacts 19, 18 and 20. Silicide contacts 19, 18 and 20 are exposed by forming a patterned mask resist layer on planarization layer 38. Subsequently, planarization layer 38 is then selectively etched through the resist mask (not shown). The photoresist is subsequently removed leaving the exposed silicide contacts as shown in FIG. 3.

Then a copper-alloy thin film layer is deposited over planarization layer 38 and silicide contacts 19, 18 and 20. The Copper-alloy includes titanium in concentrations less than 10 atomic percent, preferable one atomic percent. As will become more clear in the discussion to follow, the addition of titanium into the copper which is subsequently oxidized by diffusion of oxygen into the copper allows the stresses of the copper thin film to be controlled.

Although a copper-alloy is used in this exemplary embodiment, other alloys may be used, for example, such as an aluminum-alloy.

Figure 4:
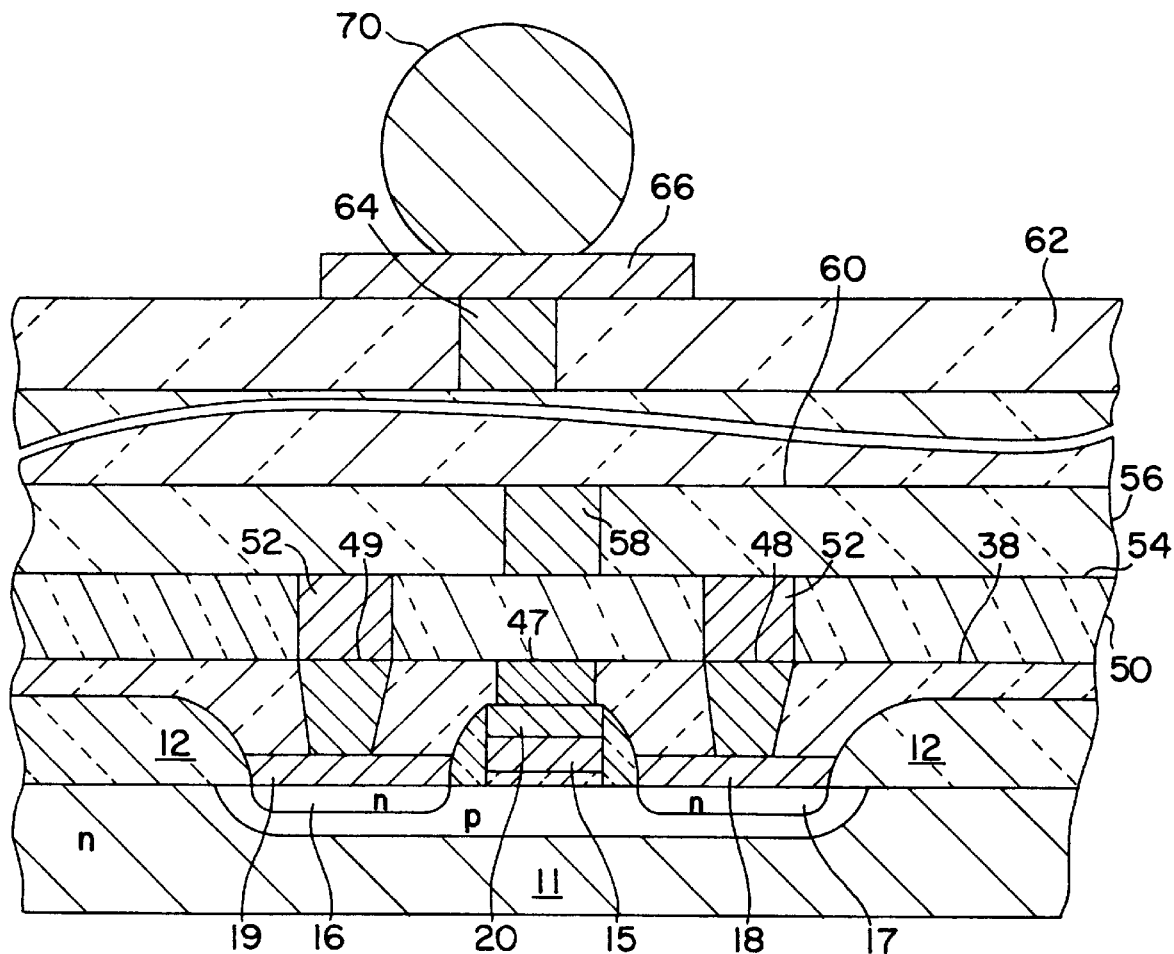
FIG. 4 is a cross-sectional schematic view of the exemplary embodiment of the present invention after the formation of source, drain and gate NMOS contacts by deposition, thermal annealing and selective etching and the inclusion of multilevel thin film interconnect wiring and isolation.

The copper-alloy formed on planarization layer 38 is selectively removed forming copper-alloy contacts 49, 48 and 47 contacting silicide contacts 19, 18 and 20 as shown in FIG. 4. Removal of the copper-alloy formed on planarization layer 38 may be performed by an etchback process which includes successive steps of etching and depositing of the copper-alloy so that the exposed areas over the silicide contacts are filled with the copper-alloy.

Then, the NMOS device is annealed in a conventional annealing process in an oxygen ambient to form titanium oxide in copper-alloy contacts 49, 48 and 47. During the annealing process, the copper-alloy layer is exposed to an oxygen ambient which diffuses into the copper-alloy contacts. The oxygen ambient must be maintained at a sufficient pressure to cause the oxygen to migrate into the copper-alloy contacts. As a result, the titanium reacts with the oxygen ambient during the annealing process to form copper titanium oxide.

The addition of titanium which is oxidized internally to the copper alters the stresses present in the contacts. The titanium oxide molecule has a different atomic volume than the original titanium atoms. Since the size of the titanium oxide molecule is different from the size of the titanium atom, the change in size results in the introduction of compressive or tensile stresses in contacts 49, 48 and 47. In addition, titanium was selected for its compatibility with the material used for contacts 49, 48, and 47.

A general rule for oxidation for bulk materials shown in P. Kofstad, *High Temperature Corrosion*, p. 24 1988, incorporated herein by reference, has been found useful to the present invention. Generally, when the oxide to metal volume ratio is smaller than one, the growth and stresses created with oxidation will be tensile. The same principle applies to carbide to metal volume ratio and to nitride to metal volume ratio. Elements which exhibit this characteristic and which are compatible with the metal used in the thin film will be referred to generally as contractible elements. If this ratio is greater than one, the growth and stresses created with oxidation will be compressive. The same principle applies to carbide to metal volume ratio and to nitride to metal volume ratio. Elements which exhibit this characteristic and which are compatible with the metal used in the thin film will be referred to generally as expandable elements. Table 1 below summarizes the oxide to metal volume ratio for several different metals.

The volume ratio of oxide to titanium is 1.73, see the table below, which is greater than one, thus the stresses added to the copper-titanium contacts by the formation of oxides of titanium will be compressive since titanium is an expandable element.

TABLE I

| Oxide | Oxide to Metal Volume Ratio | Oxide | Oxide to Metal Volume Ratio |
|---|---|---|---|
| $K_2O$ | 0.45 | NiO | 1.65 |
| $Na_2O$ | 0.97 | FeO | 1.7 |
| $Li_2O$ | 0.58 | CoO | 1.86 |
| MgO | 0.81 | $Cu_2O$ | 1.64 |
| CdO | 1.21 | $SiO_2$ | 2.15 |
| ZnO | 1.55 | $Ta_2O_5$ | 2.5 |
| $Al_2O_3$ | 1.28 | $TiO_2$ | 1.73 |
| $Cr_2O_3$ | 2.07 | | |

From the above table, it can be seen that K, Na, Li and Mg are contractible elements while Cd, Zn, Al, Cr, Ni, Fe, Co, Cu, Si, Ta and Ti are expandable elements.

The introduction of extra compressive or tensile stresses is useful in changing the extrinsic stress state of thin film conductor and preventing stress related reliability problems such as stress-voids and hillock formation.

However, the effect on the electrical conductivity of the thin film must be considered when adding the solute and precipitates thereof into the thin film. From an electrical view point a number of factors must be considered including that alloying decreases conductivity of the thin film while the precipitation of sufficiently large oxide, nitride or carbide precipitates of the solute increases electrical conductivity. Although, the precipitates increase electrical conductivity, however, in the beginning of the internal oxidation, nitridation or carburization process a fine distribution of particles is created. The particles have a high scattering power for charge carriers produced thus causing an increase in resistivity. However, aging at sufficiently high temperatures and/or sufficiently long time causes particulate growth and a decrease in resistivity. This is ostwald ripening in which small crystals, more soluble than larger crystals, dissolve, thus contributing to the growth of larger particles. Thus, in addition to annealing to form the oxide, carbide or nitride precipitates, the thin film should be heated for a sufficient time and temperature to cause ostwald ripening.

The diameter or size of precipitates may be in the range from 20 to 2000Å. The solute may be evenly distributed in the solvent. The precipitate size may be proportional to the concentration of the dissolved atomic O, N or C available. Typically, until equilibrium is established, there would be a gradient of dissolved atomic O, N or C available to react with the solute. The precipitates may therefore be smaller or less in number as a function of increasing distance from the originating source where atomic O, N or C enters the solvent.

Thin films having a thickness in the range from 100 $\mu$m to 1 $\mu$m may utilize the process as described above for applications such as interconnections on ceramic substrates, electronic modules etc. Thin films having a thickness in the range from 1,000 Å to 1 $\mu$m may utilize the invention herein for interconnection wiring on integrated circuits.

Although shown in the exemplary embodiment, the materials of the thin film are not limited to copper and titanium.

The thin film may comprise any metal solvent and metal solute metal which when added to the solvent at a much lower concentration than the solvent metal may be heated in an oxidizing, nitrating or carburizing ambient so that the solute metal internally oxidizes, nitrides or forms carbides in the solvent metal without segregating to the surface of the thin film and without oxidizing, nitriding or carburizing the solvent metal. The solute must be more reactive, preferably greatly more reactive, than the solvent. In addition, the diffusion of the reaction impurity into the alloy must be much larger than that of the solute to the free surface of the thin film where the impurity may form and cover the thin film with a layer of oxide, nitride or carbide.

The ambient may be a liquid or gas containing O, N or C or a molecule containing O, N or C such as $O_2$, $N_2$, $CH_4$, $C_2H_2$, $H_2S$, $NH_3$, $H_2O$ etc. that will decompose to provide atomic O, N or C at the surface of the solvent forming the thin film.

In addition, the concentration of solute in solvent is critical when concentrations of solute are so great that oxidation, nitridation or carburization will result on the surface of the thin film instead of within the thin film. See L. Charrin, A. Combe, and J. Cabone, *Oxidation of Metals*, 37, 65 (1992) incorporated herein by reference.

For example the solvent may include Al, Ag, Cu, Au, Ti, W, Co, Ni, Cr and Ta. Whereas the solute may be selected from the group of K, Na, Li, Mg, Cd, Zn, Al, Cr, Ni, Fe, Co, Cu, Si, Ta, Ti, Y, Sn, Mn and rare earth metals.

Further demonstrating the control of stresses in thin films in accordance with the exemplary embodiment of the present invention, consider the internal oxidation of a silver (Ag) thin film conductor with a small amount of solute. If the desire is to suppress hillock formation upon thermal cycling, then it would be beneficial to increase the tensile stress in the silver alloy conductor. From Table 1 above, the possible solutes to add to the silver conductor are the ones with a metal to oxide ratio less than one.

As discussed above, when the oxide to metal volume ratio is less than one, the growth and stresses with oxidation will be tensile. And if this ratio is greater than one, the growth and stresses with oxidation will be compressive. Here, the addition of tensile stresses will help avoid hillock formation. Thus, the solute metals would be K, Na, Li, or Mg.

In contrast, if it is desirable to decrease the amount of stress-voiding that occurs in the silver conductor, then compressive stresses in the film should be increased. This is accomplished by adding solute elements to the silver conductor that have oxide to metal atom ratios greater than one after internal oxidation. From Table 1, these solute elements may be Cd, Zn, Al, Cr, Ni, Fe, Co, Cu, Si, Ta or Ti.

In a second exemplary embodiment of the present invention, the thin film is used to form interconnection lines on a semiconductor substrate or an integrated circuit chip for interconnecting different devices, for example, bipolar, PMOS, NMOS and CMOS devices, located on the semiconductor substrate. The devices to be connected are omitted (not shown) and formation of the interconnection lines are only shown for clarity.

Referring to FIG. 4, a first layer 50 of dielectric material such as silicon dioxide, diamond-like carbon, polyimide, and flowable oxide may be formed over planarization layer 38. Layer 50 may be patterned by way of a mask and reactive ion etching to form channels or grooves therein and openings to contacts 49 and 48. A layer of metal 52 may be formed in the channels and openings and subsequently planarized to be coplanar with the dielectric upper surface by chemical-mechanical polishing to form upper surface 54 of layer 50.

As shown in FIG. 4, a second layer 56 of dielectric such as silicon dioxide or as enumerated above may be formed over upper surface 54 of layer 50. Second layer 56 may be patterned by way of a mask and reactive ion etching to form channels therein to metal 52 in planarization layer 50. A layer of metal 58 may be formed in the channels and openings and subsequently planarized by chemical-mechanical polishing to form upper surface 60 of layer 56 and metal 58.

Additional layers of insulation alone or with patterned metal may be formed over layer 56 and metal 58. Top layer 62 containing metal 64 may have a solder pad 66 thereover for external interconnections via wire bonding, solder bumps etc.

In addition, after building the multilevel interconnect structure, C4 bumps or solder balls are deposited on top of the contact pads (66). The solder balls are typically made of Pb—Sn alloy materials, although other alloy elements may be used. In either case, the embodiment of this disclosure may also be applied to these solder balls to vary their mechanical properties. An example of C4 bumps or solder balls is described in U.S. Pat. No. 5,207,585 which issued on May 4, 1993 to Byrnes et al. which is incorporated herein by reference.

The invention may be utilized to vary the hardness or rigidity of metal interconnects prior to chemical-mechanical polishing whereby the polishing characteristics of the metal are enhanced to prevent dishing, smearing, interface (metal/dielectric) separation etc. The formation of precipitates in a solvent metal tends to harden the solvent metal and to improve wearability.

Figure 5A:
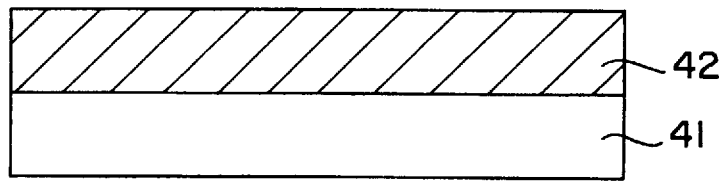
FIGS. 5a–5d shows the process sequence for constructing interconnections using level filled interconnection groove metallization in accordance with an exemplary embodiment of the present invention.
Figure 5B:
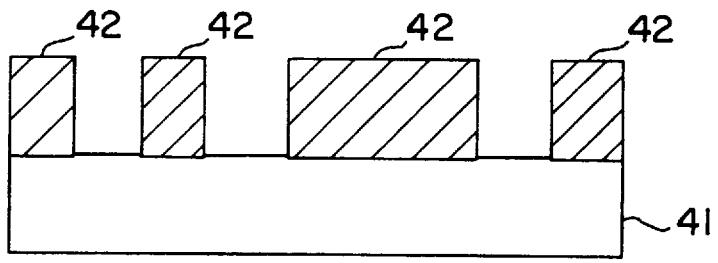

As shown in FIG. 5a, a planar dielectric layer 42 is formed on substrate 41 using, for example, chemical vapor deposition. Then planar dielectric layer 42 has trenches formed therein in a pattern. The trenches are formed by depositing and forming a patterned resist layer on planar dielectric layer 42. Subsequently, planar dielectric layer 42 is then selectively etched through the resist mask (not shown) forming the etched trenches. The photoresist is subsequently removed leaving a patterned planar dielectric layer 42 as shown in FIG. 5b.

Figure 5C:
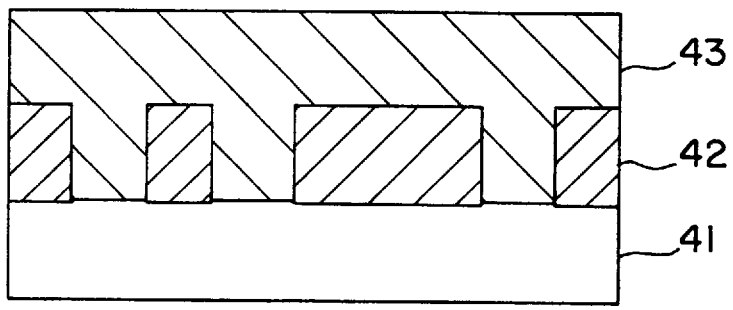
Figure 5D:
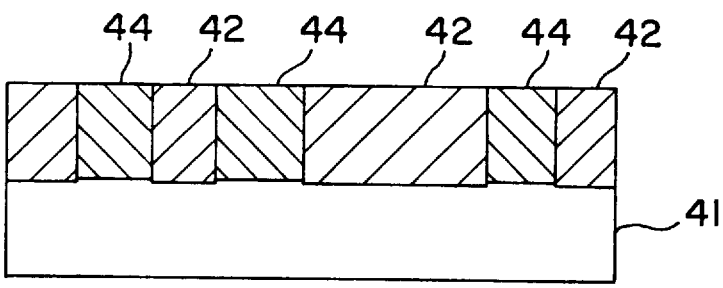

Then as shown in FIG. 5c, a blanket layer 43 of Cu(Ti 1%) is formed over patterned planar dielectric layer 42. The substrate is then annealed in an oxygen ambient to form titanium oxide evenly distributed in blanket layer 43.

Finally, blanket layer 43 is selectively removed using a chemical mechanical polish (CMP) process in which the excess blanket layer not formed within the trenches is removed forming interconnection lines 44 for interconnecting the devices formed on substrate 41. For example, substrate 41 may include the embodiment in FIG. 4 having an upper surface of dielectric layer 38 and contacts 47–49.

Adjustment of the stresses of the interconnection lines 44 is particularly critical when using chemical-mechanical polish (CMP) because the process mechanically removes the excess material of blanket layer 43 formed above dielectric layer 42 and above the trenches in dielectric layer 42. The stresses of interconnection lines 44 may be altered by adding solute metals which are subsequently oxidized so that interconnection lines 44 may withstand the mechanical polishing process.

Although, the excess material of blanket layer 43 is removed by CMP in the exemplary embodiment, the excess material may be removed by other methods known to those of skill in the art, for example, by etchback techniques.

In addition, the above process may be repeated where successive layers of dielectric films containing interconnection lines may be formed on other layers subsequent dielectric films containing interconnection lines to form a multi-layered semiconductor device.

EXAMPLE I

A silver thin film conductor with additions of magnesium is heated in an oxidizing atmosphere to a temperature such that silver oxide does not form at the surface (temperatures over 250° C.), and decomposes where the oxygen will diffuse into the silver where it reacts with the magnesium to form magnesium oxide. In this example, the volume of the magnesium atom changes from about 23.23Å$^3$ per atom of magnesium to 18.7Å$^3$ per molecule of magnesium oxide which results in an increase in tensile stresses. The increase in tensile stress, neglecting other factors, may be calculated as follows.

Per atom of Mg, the volume strain is 4.53/23.23 or 0.2, and the corresponding bilateral strain is 0.07. If the concentration of Mg in Ag was 0.01, the overall strain;$_{xx}$ introduced in the Ag film by internal oxidation would be 0.0007. The corresponding stress $r_{xx}$ would be given by:

$$r_{xx} = E/(1-v) * ;_{xx} \quad (1)$$

where E is the modulus of elasticity of Ag, and v the Poisson ratio of Ag. In this example, the increase in tensile stress fox the Ag thin film conductor may be calculated from the above parameters to be 3.4×10$^8$ dynes/cm$^2$. This value is about 10% to 20% of the expected as-deposited intrinsic tensile stress of the alloy before internal oxidation.

EXAMPLE II

A thin film of Ag-alloy containing an addition of Si is formed. The thin film is heated in an oxygen ambient which leads to oxidation of the Si. This results in an increase in volume for the Si from 16Å$^3$ in the Ag solution to about 45Å$^3$ for SiO$_2$ in the Ag solution. For a concentration of about 0.01 of Si in Ag, ;$_{xx}$ would be 0.006. Using equation (1) above, this would give an increase in compressive stress in the Ag(Si) alloy of 2.9×10$^9$ dynes/cm$^2$. The magnitude of this increase in compressive stress would be expected to be about the same as the intrinsic tensile stress in the alloy before internal oxidation and may possibly put the alloy in a net compressive state.

END OF EXAMPLE II

Instead of using Ag, Cu which is more reactive may be used. The process of internal oxidation using Cu is more difficult because the oxygen ambient pressure must be maintained sufficiently low to avoid the formation of Cu$_2$O.

In addition to using oxygen as the ambient, a carbide or nitride ambient may be used. For example, this process may be applied to internal nitridation of, for example, Fe films with Al, Ti, Zr, Hf additions, or internal carburization using a carrier gas such as CH$_4$ or C$_2$H$_2$, or sulfidation with, for example, H$_2$S.

The improvement in mechanical properties with internal oxidation of two thin metallic films, Ag(2% Ta) and Cu(1% Ti) are discussed below. The change in strain D;$_{deformation}$, that occurs with heating and cooling metallic thin films is directly related to the tendency for a film to form hillocks and stress-voids. The tendency for a thin film to form hillocks and stress voids may be approximated by:

$$D;_{deformation} = Dr_{temp}/Y_i \quad (2)$$

where D;$_{deformation}$ is the change in strain over the temperature range of interest, Dr$_{temp}$ is the change in stress over the same temperature range and Y$_i$ is the Young's modulus of the film.

In order to limit the amount of stress voiding or hillock formation that occurs, it is necessary to have D;$_{deformation}$ as small as possible. For equation (2), this is done by either having a small Dr$_{temp}$, a large Young's modulus or a combination of both. The data presented below for Ag(2% Ta) and Cu(1% Ti) films demonstrate that Drop is reduced and the Young's modulus is increased by the addition of the alloy element and by annealing in an oxidizing ambient. It should be noted that both the Ag(2% Ta) and Cu(1% Ti) thin films have about 0.02 and 0.01 atomic percent oxygen disposed within them which was gathered from the vacuum environment during deposition of the thin film on the substrate.

Figure 6:
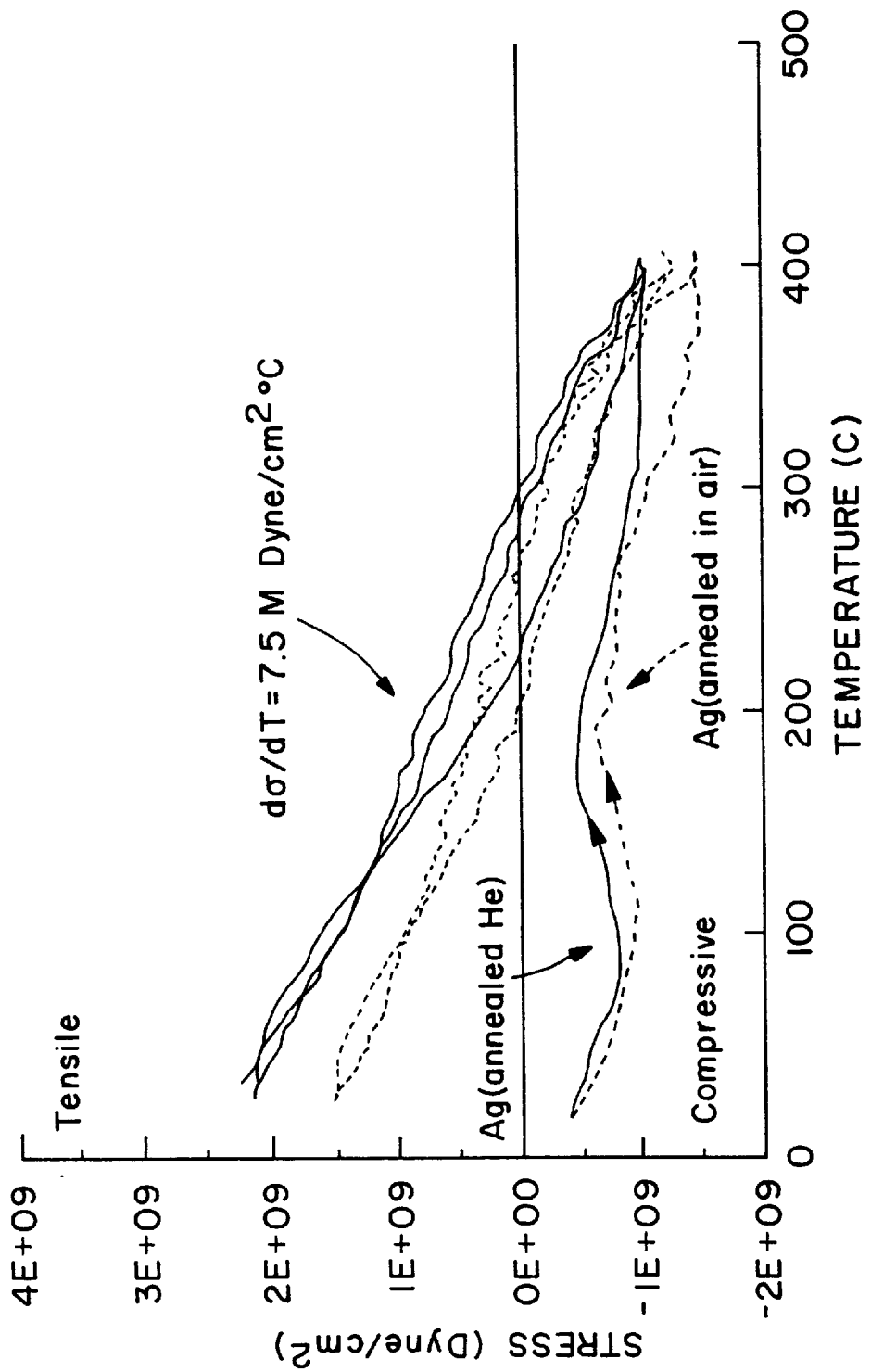
FIG. 6 is a plot of stress versus temperature for an Ag thin film annealed in air and another Ag thin film annealed in He.

FIG. 6 is a plot of stress versus temperature for a Ag film annealed in air and a Ag film annealed in He. Consider the film annealed in He and indicated by the solid line. The as deposited stress is approximately zero. With heating, the compressive stress in the film increases to about −1×10$^9$ dynes/cm$^2$ until approximately 100° C. With further heating to 200° C., the compressive stress is relaxed. This low temperature relaxation is characteristic of grain growth and hillock formation that occurs in metallic thin films. With further heating to 400° C., the compressive stress increases linearly to a value of −1×10$^9$ dynes/cm$^2$. With cooling the amount of tensile stress in the thin film increases with the slope of −7.5M dynes/cm$^2$-°C.

When the thin film was annealed in air as shown by the dashed line, the stress versus temperature behavior remains the same indicating that oxidation of the pure silver has no effect on the mechanical properties of the thin film.

Figure 7:
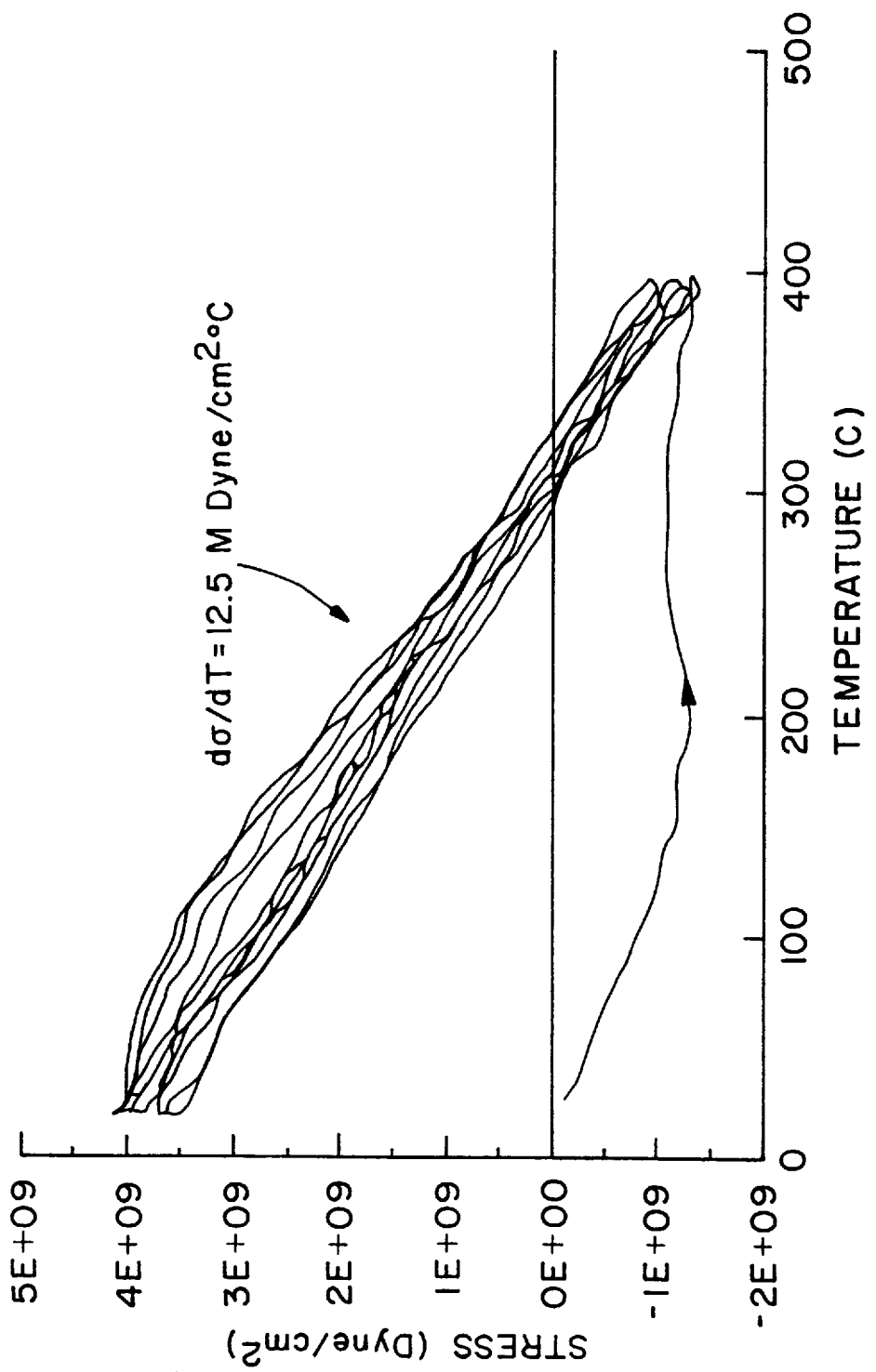
FIG. 7 is a plot of stress versus temperature for a film of Ag having 2% Ta.

FIG. 7 shows that when 2% Ta is added to the silver, mechanical properties of the thin film improve. In this figure, the stress versus temperature behavior for a film annealed in He is presented. During heating, the film is under compressive stress and there is little change in the compressive stress from about 200° to 400° C. From equation (2), this implies no change in strain and improved hillock formation and stress-voiding resistance as compared to pure silver. With cooling, the tensile stress of the thin film increases with a slope of −12.5 Mdynes/cm$^2$-°C. This is higher than the pure silver film. The slope of the stress versus temperature curve is directly proportional to the Young's modulus, indicating that the film containing Ta has a higher Young's modulus and is stiffer as compared to the pure Ag film. From equation (2), this leads to the conclusion that less strain exists upon cooling for the Ag(2% Ta) film.

Figure 8:
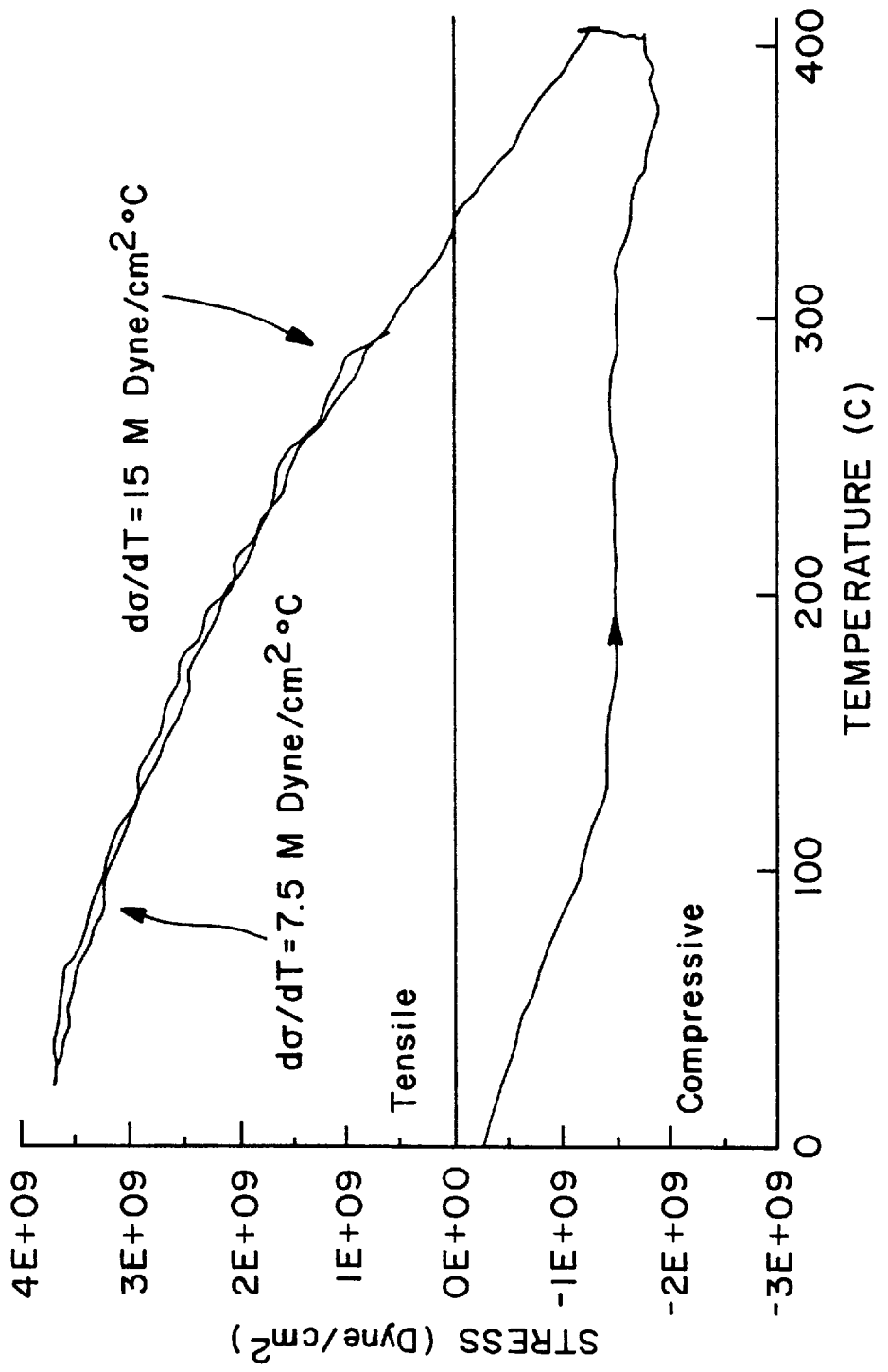
FIG. 8 is a plot of stress versus temperature showing the improvement in mechanical properties of a thin film of Ag (2% Ta) when annealed in air.

When the Ag (2% Ta) thin film was annealed in air, as opposed to He, even further enhancement of mechanical properties are observed, demonstrating the improvement of mechanical properties obtained by internal oxidation. FIG. 8 demonstrates that with thermal cycling, this film has a larger compressive stress with heating, which should help prevent stress-voiding and hillock formation, and a larger slope of −15 Mdyne/cm$^2$-°C. and a Young's modulus with cooling (above 200° C.) as compared to the He annealed film of FIG. 7. From equation (2), both of these factors imply smaller strains and better resistance to stress voiding and hillock formation for this thin film because of internal oxidation that occurs when annealing in air.

Figure 9:
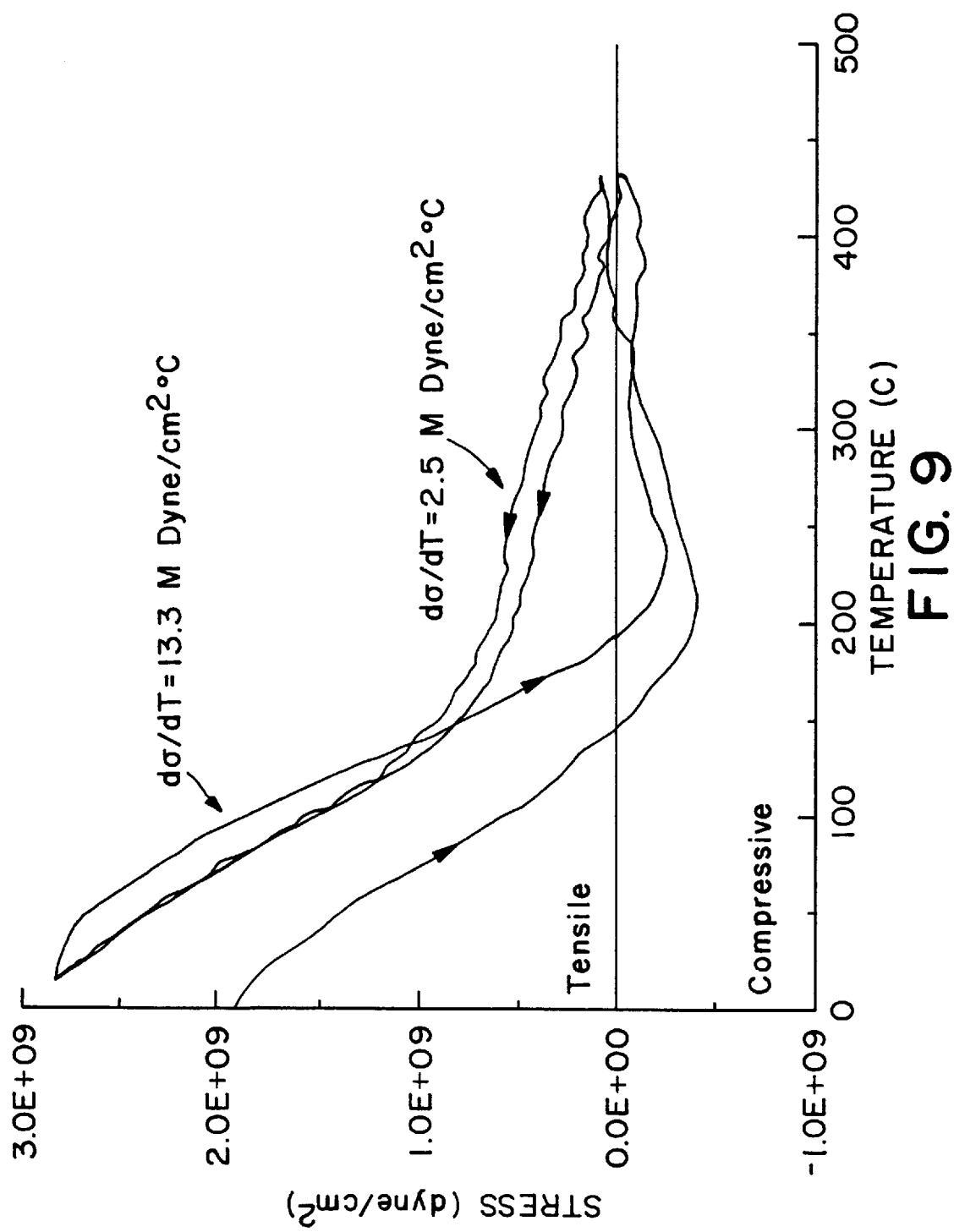
FIG. 9 is a plot of stress versus temperature of a thin film of Cu showing the mechanical properties of the thin film when heated.
Figure 10:
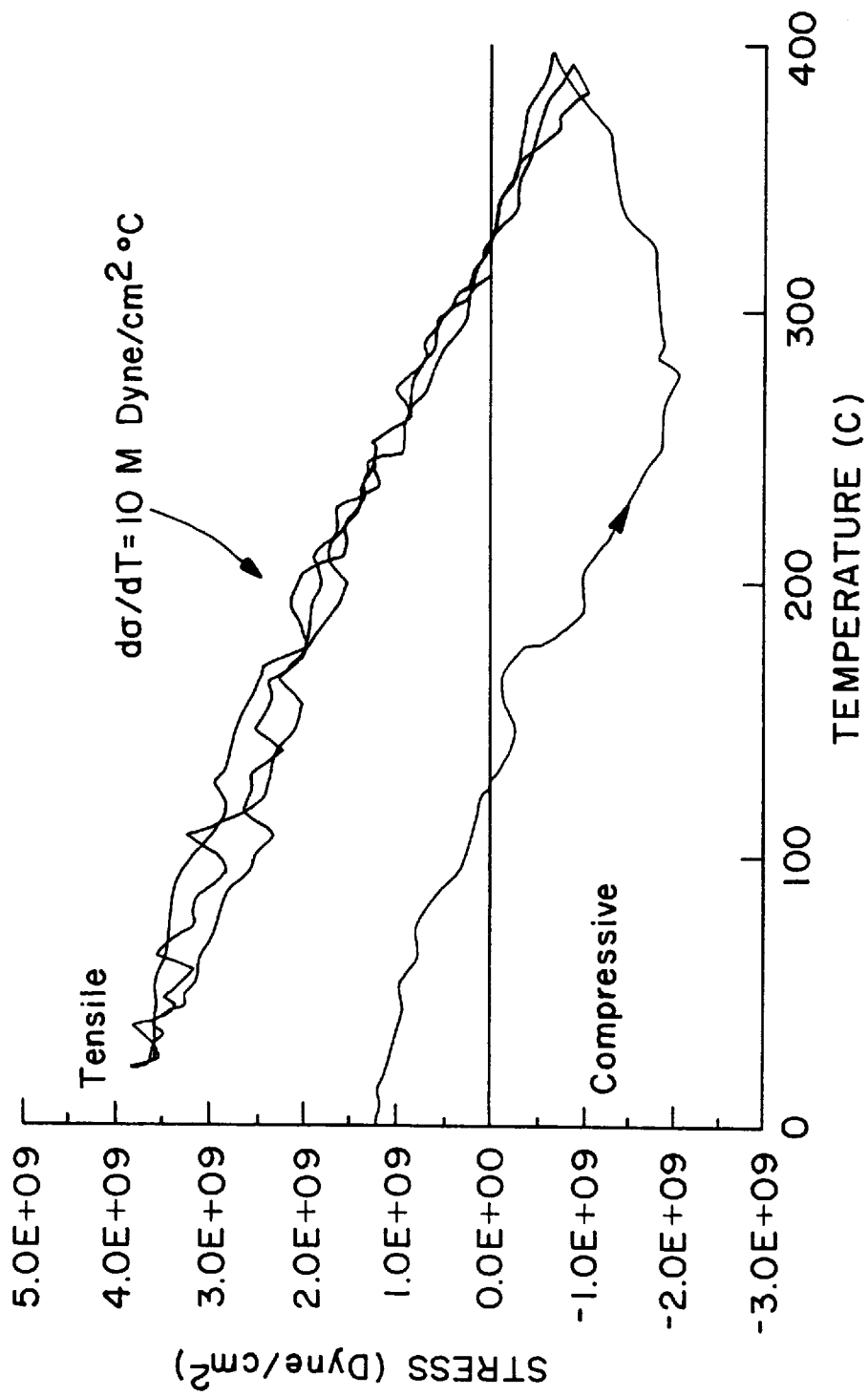
FIG. 10 is a plot of stress versus temperature for Cu(1% Ti) thin film showing the changes in compressive stresses after internal oxidation.

FIGS. 9 and 10 show similar results for Cu and Cu (1% Ti) films, respectively. With heating the pure Cu film, there is compressive stress relaxation at 200° to 250° C., signalling hillock formation and a slope upon cooling of −2.5 Mdyne/cm$^2$-°C. The Cu film with 1% Ti, does not have the signatures for hillock formation, compressive stress relaxation, and has a stiffer slope upon cooling of −10.0 Mdyne/cm$^2$-°C., which is presumably due to the addition of Ti and the oxidation of Ti with thermal cycling.

The method by which the thin film and precipitates of the solute may be formed on substrates is not limited to a particular method. To those skilled in the relevant art many different introduction techniques such as electrochemical deposition, sputtering, co-physical vapor deposition, and co-chemical vapor deposition may be used. For example, the thin film may be formed on a substrate in an oxide, nitride or carbide ambient so that the oxide, nitride or carbide is introduced into the thin film during the deposition process. Then the thin film may be annealed to form oxide, nitride or carbide precipitates of the solute in the solvent. Alternatively, the oxidation, nitriding or carborizing of the solute may occur during the deposition process thus eliminating the need for a subsequent annealing process. Also, the solvent and solute may be formed on the substrate simultaneously or sequentially.

Further, the thin film may have a thickness greater than that used for contacts or interconnection lines on a semiconductor substrate. For example, the thin film may have a thickness of up to five millimeters depending upon the particular use of the thin film.

In addition, the substrate on which the thin film is formed includes, for example, amorphous silicon, single crystal silicon, polycrystalline silicon, amorphous germanium, single crystalline germanium, polycrystalline germanium, single crystal gallium arsenide, amorphous gallium arsenide, and polycrystalline gallium arsenide. Further, other semiconductor or compound semiconductor substrates selected from columns IIb, IIa, IVa, Va, and VIa of the periodic table may be used. The thin film may be formed directly on the substrate or on an intermediate layer formed on the substrate as shown in the first exemplary embodiment.

Figure 11:
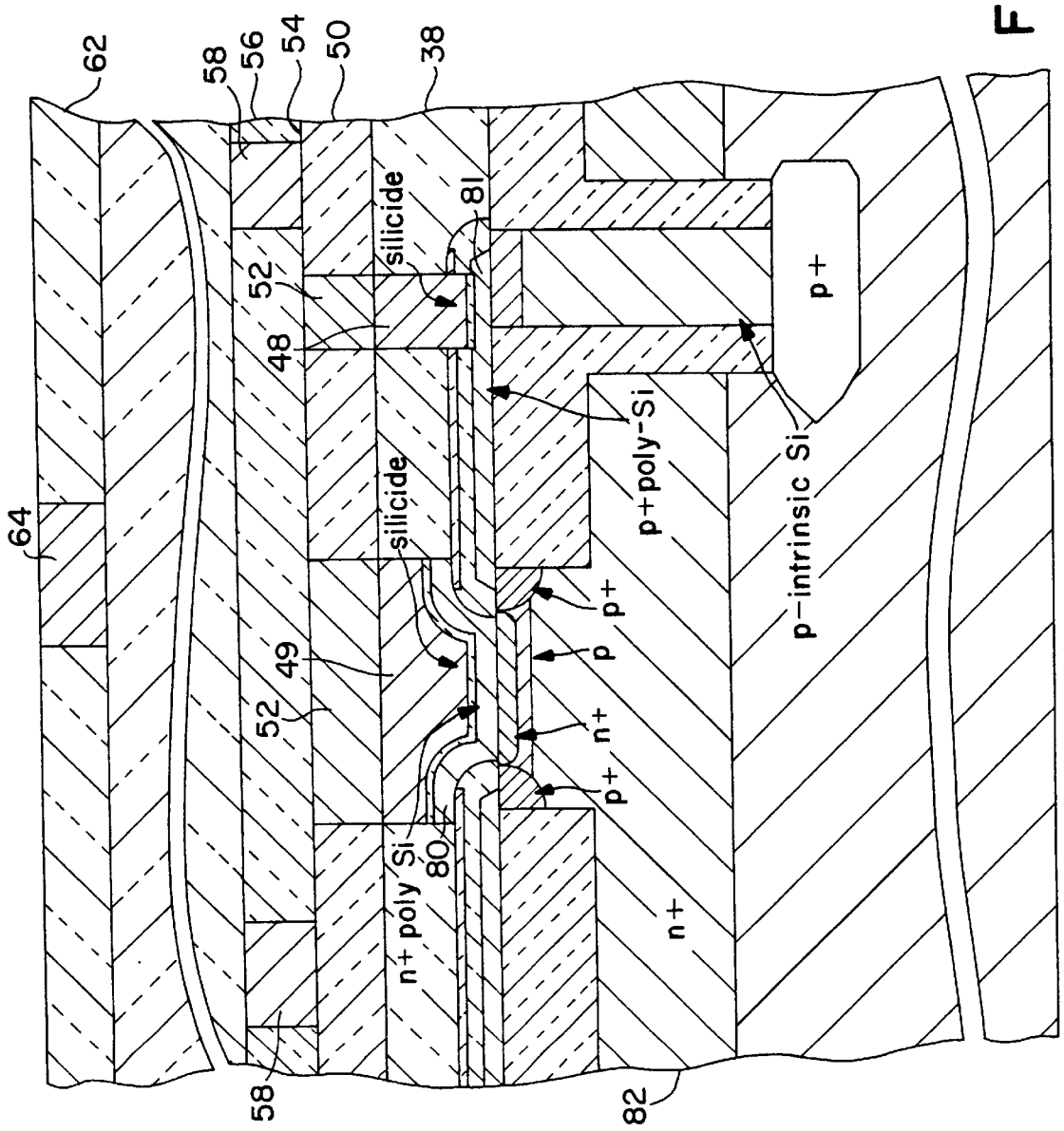
FIG. 11 is a cross-sectional schematic view of the exemplary embodiment of the present invention after the formation of emitter, base and collector bipolar contacts by deposition, thermal annealing and selective etching and the inclusion of multilevel thin film interconnect wiring and isolation.

Furthermore, thin films formed in accordance with the inventive method are not limited to contacts for CMOS devices or interconnection lines for semiconductor devices. In addition, the preferred embodiments of this disclosure can also be used for the construction of BICMOS and/or Bipolar integrated circuits with active emitter 80, base 81 and collector 82 regions as shown in FIG. 11. Like references are used for functions corresponding to the apparatus of FIG. 4. Other exemplary embodiments may include the formation of the thin film conductors on (1) magnetic tape heads as those shown in U.S. Pat. No. 4,383,284 issued to Isshiki and entitled Perpendicular Magnetic Head and Method of Manufacturing the Same, U.S. Pat. No. 5,279,026 issued to Uhde and entitled Process for Producing a Thin-film Magnetic Tape Head, and Japanese Patent Document 63-274402, each of which is incorporated herein by reference; (2) magnetic tape such as shown in U.S. Pat. No. 5,253,122 issued to Chiba et al. and entitled Recording of Digital Video Signals on a Medium having a Particular Energy Product and Surface Roughness, Patel and Richards, *The Emerging Role of Flexible Media*, IEEE, Vol. 81, No. 4, pp. 595–606, each of which is incorporated herein by reference; (3) optical storage devices such as those shown in Dayton, *The Promise of CD-ROM is Now Being Realized*, Office, September 1989, vol. 110 pp. 50, 56; (4) magnetic films as shown in U.S. Pat. No. 5,063,120 issued to Edmonson et al. and entitled Thin Film Magnetic Media, each of which is incorporated herein by reference; and (5) wear resistant thin film optical coatings such as those discussed in U.S. Pat. No. 5,190,807 issued to Kimock et al. and entitled Abrasion Wear Resistant Polymeric Substrate Product and U.S. Pat. No. 4,077,830 entitled Laminate and Method for Protecting Photographic Element, each of which is incorporated herein by reference.

For example, a magnetic thin film could be formed on a magnetic hard disk drive of a computer such as those shown in U.S. Pat. No. 5,063,120 and *On data security of magnetic data media*, Output, pp. 33–37, February 1986, each of which is incorporated herein by reference. By using the method as describe above, the mechanical strength of the magnetic thin film may be increased by annealing in an oxidizing, nitriding or carborizing ambient. The oxide, nitride and carbide precipitates formed in the thin film would strengthen the magnetic thin film. This process would help protect the hard disk from damage which may result if the head for reading the hard disk contacts the hard disk.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for forming a thin film on a substrate, which comprises:

(a) forming an alloy on the substrate wherein the alloy includes a solvent metal and a solute wherein the solvent is selected from the group consisting of Al, Ag, Cu, Au, Ti, W, Co, Ni, Cr and Ta; and (b) annealing said substrate and said alloy in one of an oxidizing, nitriding and carburizing ambient, said ambient reacting with said solute to form respectively one of oxide, nitride and carbide precipitates of the solute in the solvent.

2. A method for forming a thin film on a substrate, which comprises:

(a) forming an alloy on the substrate wherein the alloy includes a solvent metal and a solute, wherein the solute is selected from the group consisting of K, Na, Li, Mg, Cd, Zn, Al, Cr, Ni, Fe, Co, Cu, Si, Ta, Ti, Y, Sn, Mn and rare earth metals; and (b) annealing said substrate and said alloy in one of an oxidizing, nitriding and carburizing ambient, said ambient reacting with said solute to form respectively one of oxide, nitride and carbide precipitates of the solute in the solvent.

3. A method for forming a thin film on a substrate, which comprises:

(a) forming an alloy on the substrate wherein the alloy includes a solvent metal and a solute; and (b) annealing said substrate and said alloy in one of an oxidizing, nitriding and carburizing ambient, said ambient reacting with said solute to form respectively one of oxide, nitride and carbide precipitates of the solute in the solvent;

wherein the thin film and the substrate form a magnetic tape.

4. A method for forming a thin film on a substrate, which comprises:

(a) forming an alloy on the substrate wherein the alloy includes a solvent metal and a solute; and (b) annealing said substrate and said alloy in one of an oxidizing, nitriding and carburizing ambient, said ambient reacting with said solute to form respectively one of oxide, nitride and carbide precipitates of the solute in the solvent;

wherein the thin film is a thin film conductor on one of a magnetic tape head, an optical disk head, and a magnetic film.

5. A method for forming a thin film on a substrate, which comprises:
   forming an alloy on the substrate wherein the alloy includes a solvent metal and a solute; and
   (b) annealing said substrate and said alloy in one of an oxidizing nitriding and carburizing ambient, said ambient reacting with said solute to form respectively one of oxide, nitride and carbide precipitates of the solute in the solvent;
   wherein the thin film is used as an optical coating on the substrate.

6. A method for forming a thin film on a substrate to control tensile and compressive stresses of said thin film, said method comprises:
   forming an alloy on the substrate including a solvent metal and a solute, wherein the solvent is selected from the group consisting of Al, Ag, Cu, Au, Ti, W, Co, Ni, Cr and Ta;
   adding an impurity to said alloy which is more reactive with said solute than said solvent; and
   annealing said substrate and said alloy to react said solute and said impurity to form precipitates of said solute in said solvent, said precipitates having molecules having one of a greater atomic volume and smaller atomic volume with respect to the atoms of said solute.

7. A method for forming a thin film on a substrate to control tensile and compressive stresses of said thin film, said method comprises:
   forming an alloy on the substrate including a solvent metal and a solute, wherein the solute is selected from the group consisting of K, Na, Li, Mg, Cd, Zn, Al, Cr, Ni, Fe, Co, Cu, Si, Ta, Ti, Y, Sn, Mn and rare earth metals;
   adding an impurity to said alloy which is more reactive with said solute than said solvent; and
   annealing said substrate and said alloy to react said solute and said impurity to form precipitates of said solute in said solvent, said precipitates having molecules having one of a greater atomic volume and smaller atomic volume with respect to the atoms of said solute.

* * * * *